United States Patent [19]
Kornrumpf et al.

[11] Patent Number: 5,355,102
[45] Date of Patent: Oct. 11, 1994

[54] HDI IMPEDANCE MATCHED MICROWAVE CIRCUIT ASSEMBLY

[75] Inventors: William P. Kornrumpf, Albany; Robert J. Wojnarowski, Ballston Lake; Charles W. Eichelberger, Schenectady, all of N.Y.

[73] Assignee: General Electric Company, Schenectady, N.Y.

[21] Appl. No.: 869,090

[22] Filed: Apr. 14, 1992

Related U.S. Application Data

[63] Continuation of Ser. No. 504,821, Apr. 5, 1990, abandoned.

[51] Int. Cl.$^5$ .............................. H03H 7/38; H05K 3/10; H05K 3/30
[52] U.S. Cl. .................................. 333/33; 333/246; 333/247; 257/664; 257/728
[58] Field of Search .............. 333/33, 246, 247; 361/394, 400; 174/52.3, 255, 299, 260; 357/80; 257/664, 688, 698, 728

[56] References Cited

U.S. PATENT DOCUMENTS

| | | | |
|---|---|---|---|
| 3,192,307 | 6/1965 | Lazar | 174/260 |
| 3,303,265 | 2/1967 | Noren et al. | 174/52.3 |
| 3,982,271 | 9/1976 | Olivieri et al. | 333/247 X |
| 4,085,390 | 4/1978 | Standing | 333/247 X |
| 4,276,558 | 6/1981 | Ho et al. | 333/247 X |
| 4,731,648 | 3/1988 | Parmentier et al. | 357/80 |
| 4,768,004 | 8/1988 | Wilson | 333/247 X |
| 4,781,482 | 6/1988 | Fukuta et al. | 333/247 |
| 4,808,769 | 2/1989 | Nakano et al. | 174/255 |
| 4,811,081 | 3/1989 | Lyden | 357/80 |

FOREIGN PATENT DOCUMENTS

| | | | |
|---|---|---|---|
| 2810054 | 9/1978 | Fed. Rep. of Germany | 357/80 |
| 2173 | 1/1977 | Japan | 357/80 |
| 31042 | 2/1984 | Japan | 333/247 |

*Primary Examiner*—Robert J. Pascal
*Assistant Examiner*—Benny Lee
*Attorney, Agent, or Firm*—Geoffrey H. Krauss; Marvin Snyder

[57] ABSTRACT

Active components of a microwave system are interconnected on a substrate by a dielectric-overlay, high-density-interconnect structure in a manner which provides close impedance matching, minimizes impedance discontinuities and substantially increases the yield of good circuits.

22 Claims, 5 Drawing Sheets

HDI IMPEDANCE MATCHED MICROWAVE CIRCUIT ASSEMBLY

This is a continuation of application Ser. No. 07/504,821, filed Apr. 5, 1990, now abandoned.

RELATED APPLICATIONS

The present invention is related to application Ser. No. 07/504,760, entitled, "A Building Block Approach to Microwave Modules", by W. P. Kornrumpf, et al.; application Ser. No. 07/504,803, entitled, "Microwave Component Test Method and Apparatus", by W. P. Kornrumpf, et al. , application Ser. No. 07/504,753, entitled, "A Compact High Density Interconnected Microwave System" by W. P. Kornrumpf; application Ser. No. 07/504,769, entitled, "A Flexible High Density Interconnect Structure and Flexibly Interconnected System", by C. W. Eichelberger, et al.; and application Ser. No. 07/504,748, entitled, "Microwave Component Having Tailored Operating Characteristics and Method of Tailoring", by W. P. Kornrumpf, et al.; each of which is being filed concurrently herewith and each of which is incorporated herein by reference in its entirety.

BACKGROUND OF THE INVENTION

1. Field of the Invention

The present invention relates to the field of microwave circuits, and more particularly, to interconnection of monolithic microwave integrated circuits and/or other active devices and passive components into microwave systems.

2. Background Information

Microwave systems are often composed of monolithic microwave integrated circuits (MMICs), other active microwave devices such as GaAs transistors, passive microwave components and other non-microwave components such as logic and control structures.

A monolithic microwave integrated circuit or MMIC is an integrated circuit which is designed to operate at microwave frequencies. MMICs are normally fabricated in GaAs because of the much higher potential operating frequency which GaAs provides as compared to silicon. A typical MMIC may include one or more amplifiers, some passive components and one or more feedback loops which provide feedback from the output of an amplifier or circuit to establish a desired transfer function for that circuit.

It is known in the art to fabricate microwave systems from a variety of such components by providing a ceramic substrate having microstrip RF circuitry, DC supply lines (conductors), logic lines, control lines and contact pads fabricated thereon and by attaching devices and components such as MMICs, GaAs transistors, other microwave and supporting components to the substrate and connecting them to the circuitry on the substrate using wire bonds or tab interconnections.

Such fabrication techniques have a number of disadvantages. Thin and thick film methods of fabricating circuitry on ceramic substrates have tolerance limitations which prevent such structures from being produced with microwave characteristics which are repeatable with close tolerances. Consequently, there is substrate-to-substrate variation in the microwave characteristics of such nominally identical substrates. Further, the active microwave components such as MMICs and GaAs transistors themselves have fabrication tolerances which result in variations in operating characteristics from device to device. Further, in such structures, impedance discontinuities and mismatches are normal at the edges of MMICs and GaAs transistors. These impedance discontinuities vary with the actual placement of the chips on the surface of or in cavities in the ceramic substrate. This is because slight changes in the positioning of such devices change both the lengths of the gaps between the device and the substrate and the alignment of the device structure with the substrate structure. Further, these physical assembly tolerances result in variable interconnect bond lengths, resulting in variable inductances and consequently, varied circuit performance. These impedance mismatches also vary with actual component and substrate impedance values. Further, these and other fabrication-tolerance-induced differences in impedances result in reflections and other undesirable operational effects which degrade system operating characteristics. The cumulative effect of these differences is a wide range of system operating characteristics. Consequently, assembly of a microwave system from such components is a relatively low yield process in which many of the resulting systems do not meet specifications. A significant contributor to this low yield is the fact that many active microwave components cannot readily be accurately tested over their full expected operating frequency and power ranges in a non-destructive manner because of the difficulty of coupling such components to a test system. Consequently, many components which pass preassembly testing do not in reality meet specifications.

As the desired operating frequency of such microwave systems has increased from the neighborhood of 2 GHz to still higher frequencies in the range from 8 GHz to 16 GHz, or more, the problem of thin film and thick film fabrication tolerances and component testing have become ever more vexing.

Many MMICs and other active microwave devices include delicate structures which can easily be damaged or destroyed. These include conductors which are spaced from the surface of the GaAs by an air gap—a structure which is known as an "air bridge". Air bridges are used in these MMICs in order to provide the MMIC with particular desired operational characteristics. These delicate structures severely limit the assembly techniques which can be used to connect these devices into microwave systems. Further, such components are quite sensitive to the placement near their surfaces of conductors or dielectric materials having dielectric constants of more than one, especially in the vicinity of inductors, air bridges and field effect device gate regions.

In digital systems, individual chips can be extensively tested using wafer probe and other test systems before being committed to assembly into individual packages. After packaging, they can be further tested prior to assembly into a system. As a result, yield at system assembly is normally quite high. It is this assurance of successful assembly of digital components into an operative final system which has made feasible the provision of microcomputers and other digital systems at cost-for-performance prices which were unimaginable a decade ago.

Such pre-packaging has been impossible with active microwave devices because the losses and other penalties which packaging introduces are worse than the disease packaging would be intended to cure. Consequently, for microwave systems, post-packaging testing is not available at a component level as a final-assembly-yield-enhancement mechanism. Even full testing of components at a wafer level is not normally feasible because of the relatively large probe which is needed to provide an impedance match to the MMICs or other devices under test. However, the problem of low final yield has led to the design of some active microwave components for testing with so-called co-planar probe such as those built by Cascade Microtech. This requires that the chips be made over-sized in order to provide space on their upper surface for a microwave port having a signal conductor in the middle and two true ground conductors symmetrically disposed on opposite sides of that signal conductor. This structure is required for a co-planar probe to be connected to this microwave port in a well-matched, repeatable manner. The provision of a true ground on the upper surface of a microwave chip is not a simple matter at microwave frequencies (unlike the situation with digital chips which typically operate at frequencies of less than 50 MHz). Generally, this requires the use of a metal connection between the front and back surfaces of the chip. Such metal connections can be provided by plated through holes, but the provision of plated through holes increases the complexity of the fabrication process and decreases yield. Even those chips which are designed for co-planar probing cannot be tested at full power across their full operative range with a co-planar probe because of the poor thermal conductivity of MMICs. Consequently, design of a microwave device for co-planar probing has its own associated penalties such as increased size, increased process complexity, lower process yield and still suffers from a lack of complete assurance that test results will correlate with system performance.

A significant problem with the low yield of fully assembled systems is that such structures cannot be effectively reworked to replace faulty components because the component's connections cannot be removed in a non-destructive manner. Consequently, systems which are out of specification when assembled must be scrapped. Alternatively, if the microwave module is designed to allow rework, rework-induced damage is common, with a consequent limited reworked-induced increase in yield.

Thus, there is a continuing need for a microwave fabrication process which enables passive components to be fabricated with highly repeatable characteristics and which enables pre-testing of active devices and/or the removal and replacement of faulty components without impairing any good components when a system fails to meet specifications.

A high density interconnect (HDI) structure or system which has been developed by General Electric Company offers many advantages in the compact assembly of digital and other electronic systems. For example, an electronic system such as a microcomputer which incorporates between 30 and 50 chips can be fully assembled and interconnected on a single substrate which is 2 inches long by 2 inches wide by 0.050 inch thick. The maximum operating frequency of such systems is normally, at present, less than about 50 MHz. Even more important than the compactness of this high density interconnect structure is the fact that it can be disassembled for repair or replacement of a faulty component and then reassembled without significant risk to the good components incorporated within the system. This reworkability or repairability is a substantial advance over prior connection systems in which reworking the system to replace damaged components was either impossible or involved substantial risk to the good components.

Briefly, in this high density interconnect structure, a ceramic substrate such as alumina which may be 25–100 mils thick and of appropriate size and strength for the overall system, is provided. This size is typically less than 2 inches square. Once the position of the various chips has been specified, individual cavities or one large cavity having appropriate depths at the intended locations of the various chips are prepared. This may be done by starting with a bare substrate having a uniform thickness and the desired size. Conventional, laser or ultrasonic milling may be used to form the cavities in which the various chips and other components will be positioned. For many systems where it is desired to place chips edge-to-edge, a single large cavity is satisfactory. That large cavity may typically have a uniform depth where the semiconductor chips have a substantially uniform thickness. Where a particularly thick or a particularly thin component will be placed, the cavity bottom must be made respectively deeper or shallower to place the upper surface of that component in substantially the same plane as the upper surface of the rest of the components and the surface of the portion of the substrate which surrounds the cavity. The bottom of the cavity is then provided with a thermoplastic adhesive layer which may preferably be polyetherimide resin available under the trade name ULTEM ® from the General Electric Company. The various components are then placed in their desired locations within the cavity, the entire structure is heated to the softening point of the ULTEM ® polyetherimide (in the vicinity of 217° C. to 235° C. depending on the formulation used) and then cooled to thermoplastically bond the individual components to the substrate. At this stage, the upper surfaces of all components and the substrate are disposed in substantially a common plane. Thereafter, a polyimide film which may be Kapton ® polyimide, available from E. I. du Pont de Nemours Company, which is about 0.0005–0.003 inch (12.5–75 microns) thick is pretreated to promote adhesion and coated on one side with an ULTEM ® polyetherimide resin or another thermoplastic and laminated across the top of the chips, other components and the substrate with the ULTEM ® resin serving as a thermoplastic adhesive to hold the Kapton ® in place. Thereafter, via holes are laser drilled in the Kapton ® and ULTEM ® layers in alignment with the contact pads on the electronic components to which it is desired to make contact. A metallization layer which is deposited over the Kapton ® layer extends into the via holes and makes electrical contact to the contact pads disposed thereunder. This metallization layer may be patterned to form individual conductors during the process of depositing it or may be deposited as a continuous layer and then patterned using photoresist and etching. The photoresist is preferably exposed using a which is scanned relative to the substrate laser to provide an accurately aligned conductor pattern at the end of the process.

Additional dielectric and metallization layers are provided as required in order to provide all of the desired electrical connections among the chips. Any misposition of the individual electronic components and their contact pads is compensated for by an adaptive laser lithography system which is the subject of some of the U.S. Patents and Patent Applications which are listed hereinafter.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 4,835,704, entitled "Adaptive Lithography System to Provide High Density Interconnect" by C. W. Eichelberger, et al.; U.S. Pat. No. 4,714,516, entitled "Method to Produce Via Holes in Polymer Dielectrics for Multiple Electronic Circuit Chip Packaging" by C. W. Eichelberger, et al.; U.S. Pat. No. 4,780,177, entitled "Excimer Laser Patterning of a Novel Resist" by R. J. Wojnarowski et al.; U.S. patent application Ser. No. 249,927, filed Sep. 27, 1989, entitled "Method and Apparatus for Removing Components Bonded to a Substrate" by R. J. Wojnarowski, et al. and now abandoned; U.S. Pat. No. 4,894,115, issued Jan. 16, 1990, entitled "Laser Beam Scanning Method for Forming Via Holes in Polymer Materials" by C. W. Eichelberger, et al.; U.S. patent application Ser. No. 312,798, filed Feb. 21, 1989, entitled "High Density Interconnect Thermoplastic Die Attach Material and Solvent Die Attachment Processing" by R. J. Wojnarowski, et al. and now abandoned; U.S. Pat. No. 4,878,991, issued Nov. 7, 1989, entitled "Simplified Method for Repair of High Density Interconnect Circuits" by C. W. Eichelberger, et al.; U.S. patent application Ser. No. 305,314, filed Feb. 3, 1989, entitled "Fabrication Process and Integrated Circuit Test Structure" by H. S. Cole, et al., and now abandoned; U.S. Pat. No. 5,019,946 issued May 28, 1991, entitled "High Density Interconnect With High Volumetric Efficiency" by C. W. Eichelberger, et al.; U.S. Pat. No. 5,019,535, issued May 28, 1991 entitled "Die Attachment Method for Use in High Density Interconnected Assemblies" by R. J. Wojnarowski, et al.; U.S. Pat. No. 4,960,613 issued Oct. 2, 1990, entitled "Laser Interconnect Process" by H. S. Cole, et al.; U.S. Pat. No. 4,884,122, issued Nov. 28, 1989, entitled "Method and Configuration for Testing Electronic Circuits and Integrated Circuit Chips Using a Removable Overlay Layer" by C. W. Eichelberger, et al.; U.S. patent application Ser. No. 233,965, filed Aug. 8, 1988, entitled "Direct Deposition of Metal Patterns for Use in Integrated Circuit Devices" by Y. S. Liu, et al. and now abandoned; U.S. Pat. No. 4,882,200, issued Nov. 21, 1989, entitled "Method for Photopatterning Metallization Via UV Laser Ablation of the Activator" by Y. S. Liu, et al.; U.S. patent application Ser. No. 237,685, filed Aug. 25, 1988, entitled "Direct Writing of Refractory Metal Lines for Use in Integrated Circuit Devices" by Y. S. Liu, et al., and now abandoned; U.S. Pat. No. 4,933,042 issued Jun. 12, 1990, entitled "Method and Apparatus for Packaging Integrated Circuit Chips Employing a Polymer Film Overlay Layer" by C. W. Eichelberger, et al.; U.S. Pat. No. 4,887,153, issued Jan. 30, 1990, entitled "Method of Processing Siloxane-Polyimides for Electronic Packaging Applications" by H. S. Cole, et al.; U.S. Pat. No. 4,988,412, issued Jan. 29, 1991, entitled "Selective Electrolytic Deposition on Conductive and Non-Conductive Substrates" by Y. S. Liu, et al.; U.S. patent application Ser. No. 312,536, filed Feb. 17, 1989, entitled "Method of Bonding a Thermoset Film to a Thermoplastic Material to Form a Bondable Laminate" by R. J. Wojnarowski and now abandoned; U.S. patent application Ser. No. 363,646, filed Jun. 8, 1989, entitled "Integrated Circuit Packaging Configuration for Rapid Customized Design and Unique Test Capability" by C. W. Eichelberger, et al.; U.S. patent application Ser. No. 07/459,844, filed Jan. 2, 1990, entitled "Area-Selective Metallization Process" by H. S. Cole, et al.; U.S. patent application Ser. No. 07/457,023, filed Dec. 26, 1989, entitled "Locally Orientation Specific Routing System" by T. R. Haller, et al.; U.S. patent application Ser. No. 456,421, filed Dec. 26, 1989, entitled "Laser Ablatable Polymer Dielectrics and Methods" by H. S. Cole, et al.; U.S. patent application Ser. No. 454,546, filed Dec. 21, 1989, entitled "Hermetic High Density Interconnected Electronic System" by W. P. Kornrumpf, et al.; U.S. Pat. No. 5,040,047, issued Aug. 13, 1991, entitled "Enhanced Fluorescence Polymers and Interconnect Structures Using Them" by H. S. Cole, et al.; and U.S. patent application Ser. No. 454,545, filed Dec. 21, 1989, entitled "An Epoxy/Polyimide Copolymer Blend Dielectric and Layered Circuits Incorporating It" by C. W. Eichelberger, et al. and now abandoned in favor of divisional application Ser. No. 07/646,112, filed Jan. 28, 1991. Each of these Patents and Patent Applications is incorporated herein by reference.

This high density interconnect system has been developed for use in interconnecting semiconductor chips to form digital systems. That is, for the connection of systems whose operating frequencies are typically less than about 50 MHz, which is low enough that transmission line and other wave impedance matching effects have not needed to be considered.

The interconnection of microwave structures presents many problems, considerations and challenges not faced in the interconnection of digital systems. Use of microwave frequencies requires consideration of wave characteristics, transmission line effects, material properties at microwave frequencies, the presence of exposed delicate structures on MMICs and other components and system and component characteristics which do not exist at the lower operating frequencies of such digital systems. These considerations include the question of whether the dielectric materials are suitable for use at microwave frequencies, since materials which are good dielectrics at lower frequencies can be quite lossy or even conductive at microwave frequencies. Further, even if the dielectric is not lossy at microwave frequencies, its dielectric constant itself may be high enough to unacceptably modify the operating characteristics of MMICs, GaAs transistors and other microwave components or structures which might be interconnected using a high density interconnect structure. Since the first dielectric layer of this high density interconnect structure is applied by a lamination process involving the application of substantial pressure to the polyimide film, there is a substantial concern that air bridges and other delicate structures in microwave components may be damaged, destroyed or modified either by the lamination pressure causing them to collapse or by the infiltration of the thermoplastic adhesive into the air gap under the conductor, thereby modifying the dielectric properties of that gap, or even the mere presence of the dielectric unacceptably modifying the operating characteristics of some of the components.

Many of these devices are so sensitive to the presence of overlying dielectric layers that their manufactures do not even deposit glass passivation layers on the upper surface of their chips because even that thin dielectric layer would adversely affect the operating characteristics of the components. The use of glass passivating coatings on semiconductor chips is essentially universal in the silicon semiconductor art to prevent environmentally induced deterioration of the devices. Consequently, in the microwave art disposing any additional dielectric material on an active device or component is looked upon as a sure way to degrade performance and assiduously avoided.

OBJECTS OF THE INVENTION

Accordingly, a primary object of the present invention is to provide a high density interconnect structure suitable for interconnecting active and passive microwave components in a manner which provides high reliability, reworkability and system-to-system uniformity.

Another object of the present invention is to adapt a high density interconnection fabrication process to be compatible with microwave components and their requirements.

Another object of the present invention is to substantially eliminate the problem of impedance discontinuities in the interconnection of microwave active and passive components.

Another object of the present invention is to provide a method of interconnecting microwave components in which component-to-component impedance variations are adaptively compensated for in the interconnection network.

SUMMARY OF THE INVENTION

The above and other objects which will become apparent from the specification as a whole, including the drawings, are achieved in accordance with the present invention by mounting active microwave components on a substrate and interconnecting those components using a high density interconnect structure which is tailored to minimize impedance discontinuities and to match the impedances of interconnected components to each other.

In accordance with one embodiment, this is accomplished by forming transmission lines in the high density interconnect structure for conducting microwave signals with a well defined impedance and a minimum of discontinuities. Adaptive lithography is preferably employed to adjust the impedance characteristics of the high density interconnect structure to match component-to-component variations in the impedances of the microwave components.

In accordance with one embodiment of the invention, the dielectric layer of the high density interconnect structure is omitted or removed from those portions of active microwave components where the presence of the dielectric would undesirably modify the operating characteristics of the active component due to loading and other effects.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

We have determined that the dielectric overlay technique we use in this invention and the resulting structure changes the electrical operating characteristics of the component while the dielectric is disposed thereon, however, it does not physically damage the air bridges of an MMIC. This was done by interconnecting an MMIC using our techniques, testing electrically and then cross-sectioning that structure. This established that the lamination pressure does not damage the air bridge structure. Further, at least with the Ultem ® resin thermoplastic adhesive, the adhesive does not infiltrate into the air gap of the air bridge and finally, the overlay dielectric may be removed from an air bridge without any adverse physical effect thereon and with the electrical operating characteristics returning to their original state. Consequently, our process can be used to interconnect MMICs without undesirably modifying the dielectric properties of an air bridge, although, it may be necessary to remove the overlay dielectric from the vicinity of the air bridge after completion of the interconnection structure in order to leave the operating characteristics of the air bridge unaffected. The situation is similar with the gate regions of field effect transistors and with other sensitive components and devices. Further, we have established that a repair process for this type of structure in which the structure is heated to a sufficient temperature to render the thermoplastic adhesive substantially fluid that the high density interconnect overlay structure may be easily removed (peeled) from the substrate and active device does not adversely effect these air bridges. Any residual thermoplastic adhesive which remains after such a removal step may be removed by appropriate solvents, by plasma etching or other techniques such as laser ablation in combination with plasma etching as taught in the background HDI patents and applications. Further, our tests have also established that this high density interconnect structure does not suffer from excessive microwave losses and that microwave transmission lines (both stripline and microstrip) may be fabricated within the high density interconnect structure using adaptive lithography with controllable impedances in order to match the impedances of various components and may have structures which are tailored to transform impedances in a minimum loss and minimum reflection manner. We have also established that laser ablation of the dielectric layers over an air bridge does not adversely effect the conductor of the air bridge or modify its air gap and does successfully remove all of the dielectric material. This laser ablation dielectric removal process normally includes a plasma etch at the end of the laser ablation portion of the process in order to ensure that no residual dielectric material remains on the structure in the laser ablated region. This laser ablation process is essentially the via hole formation process which has been described in the HDI background patents and applications, but with the via hole being greatly enlarged in size as compared to via holes for inter-level conductor connection. Further, we have found that the presence of the overlay dielectric on the surface of an active microwave component such as a MMIC can have a substantial adverse effect on the operating characteristics of that active component. However, those adverse effects can normally be minimized or eliminated by removing the overlay dielectric from the active device area after completion of the high density interconnect structure. While such removal is a substantial departure from prior HDI practices, it can be done by adaptation of the via hole drilling techniques which have been practiced in the HDI process for a long time.

Thus, we have established that our high density interconnect structure and fabrication procedures are suitable for use in the fabrication and assembly of microwave systems which include MMICs and other active microwave components and can provide appropriate transmission line and other structures as needed for proper interconnection of the various components of such systems.

Figure 1:
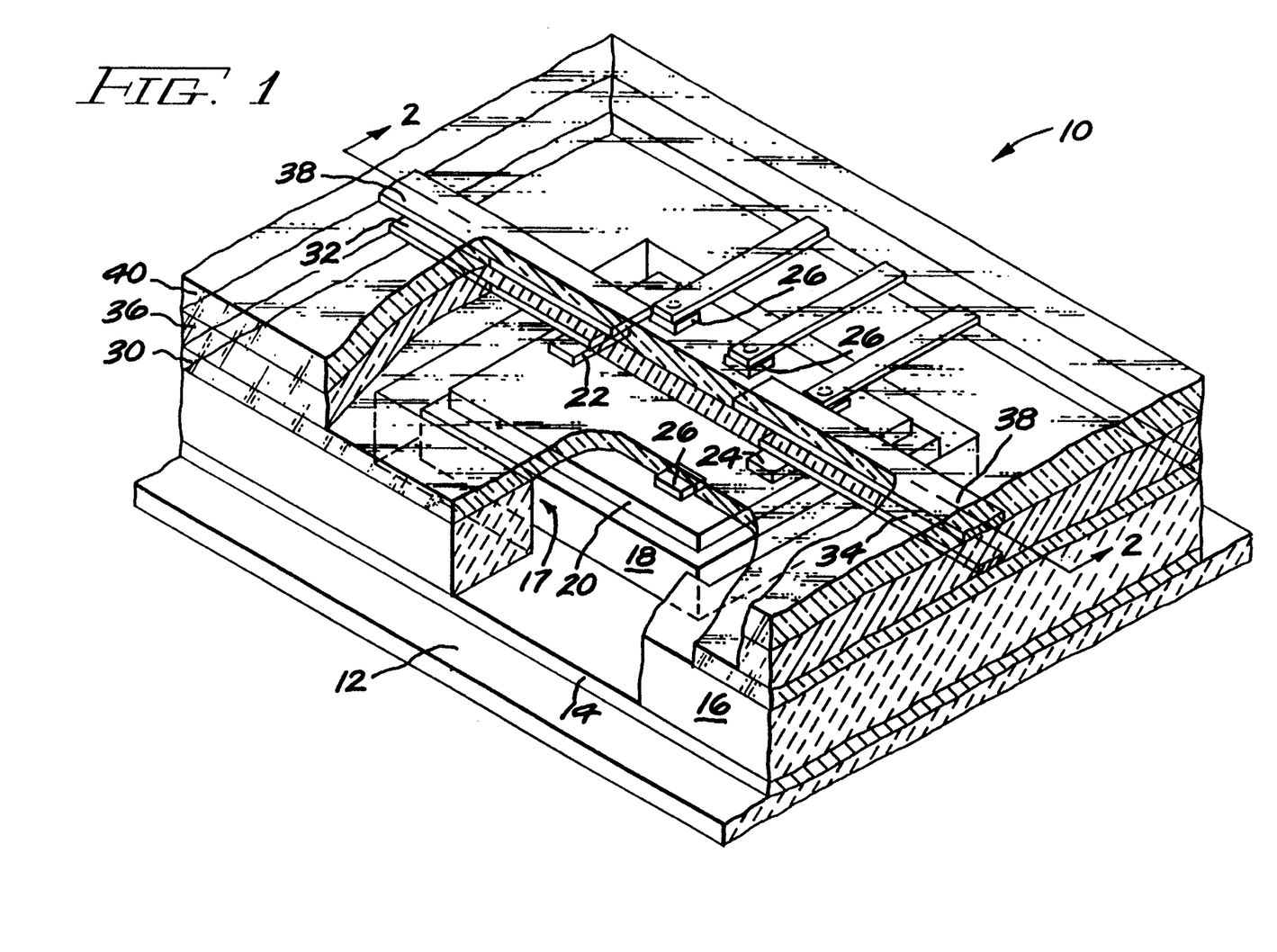
FIG. 1 is a perspective illustration of a portion of a microwave system in accordance with the present invention.

A portion of a microwave system 10 assembled in accordance with the present invention is illustrated in perspective view in FIG. 1. The system 10 comprises a system substrate or package base 12 which will be referred to hereinafter as a package base to prevent confusion with other components of the system. A ground conductor 14 is disposed on the upper surface of the package base 12 to provide a ground plane for the microwave circuitry. Alternatively, the package base may be conductive and perform the function of the ground conductor 14. A substrate 16, which may preferably be alumina or other ceramic material in accordance with system requirements, is bonded to the upper surface of the ground plane 14. The substrate 16 has an aperture 17 therein in which a device-support/heat-sink 18 is disposed. This heat sink 18 may preferably be beryllia or other high thermal conductivity material. An active microwave device 20 is bonded to the heat sink 18. This microwave device 20 may be a monolithic microwave integrated circuit or MMIC, a gallium arsenide (GaAs) transistor or other active component as is appropriate to the overall microwave system 10, or even a passive component, if desired. The illustrative active microwave component 20 has a microwave input contact pad 22 disposed on its upper surface adjacent its left-hand side in the figure and a microwave output contact pad 24 disposed on its upper surface adjacent its right-hand side in the figure. It also has a plurality of power supply, control signal and logic contact pads 26 disposed on its upper surface.

The power supply (DC), logic and control terminals 26 of the component 20 may be referred to collectively as support terminals in the sense that they are intended to carry electrical signals which support the operation of the microwave component, although those signals are not themselves microwave signals. If one of the terminals 26 is a ground terminal, then the ground terminal may be considered a support terminal. In the event that the only ground connection provided on the component 20 is a ground conductor on the back surface of the component, that ground terminal may be viewed as being distinct from the support terminals which are configured as top surface contact pads or may be considered a support terminal because of its function.

In general, the distinction between the microwave pads 22 and 24 and the other pads 26 is the fact that the microwave pads are intended to conduct signals having frequencies in excess of about 1 GHz at which transmission line and impedance mismatch considerations must be taken into account in designing the system for optimum performance while the pads 26 are designed to carry lower frequency signals for which these considerations may be ignored.

In the system 10, the active microwave device 20 is interconnected with other components of the system by a dielectric overlay interconnect system which may preferably be fabricated in accordance with the high density interconnect structure patents and applications referred to previously. This interconnect structure includes a first dielectric layer 30 which is laminated on top of the substrate 16 and the active component 20. This dielectric layer 30 bridges the gap which is disposed between the combined structure of the active component 20 and the heat sink 18 and the surrounding substrate 16. This dielectric layer may preferably be a thermoset polyimide such as KAPTON ® polyimide available from E. I. DuPont de Nemours. This polyimide layer is adhesively bonded to the substrate 16 and the active component 20 by a thermoplastic adhesive such as a polyetherimide resin which is available from General Electric Company under the trademark Ultem ®.

In this specification, when we say "thermoplastic", we mean a material which when repeatedly heated and cooled, retains substantially the same softening temperature with the result that the layer may be heated in order to render it fluid and removable. When we say "thermoset", we mean a material which on reheating, remains solid at a substantially higher temperature than the temperature at which it was initially liquid or fluid. This change in softening temperature is generally a result of cross-linking within the polymer of which the layer is formed in a manner which creates a new structure having a substantially higher melting temperature or which no longer melts.

Via holes are formed in dielectric layer 30 in alignment with the microwave contact pads 22 and 24 and the non-microwave contact pads 26. These via holes may be formed by laser ablation, as taught in the related HDI patents, with the hole then being thoroughly cleaned with a $CF_6$-$O_2$ plasma etch to ensure that there is no debris in the bottom of the via hole which would interfere with making electrical contact to the underlying contact pads. A patterned metal layer is then formed on the dielectric 30. This patterned metal layer includes a microwave input signal conductor 32 at the left-hand side of the figure and a microwave output signal conductor 34 at the right-hand side of the figure as well as dc, logic and control (support) conductors. These two microwave conductors are more clearly seen in the cross-section in FIG. 2 than in the perspective view in FIG. 1. The conductors connected to the pads 26 are configured in accordance with the related HDI patents and are not described in detail herein, the reader being referred to those patents for a fuller explanation of those conductors if such an explanation is desired.

The patterned metal layer may be formed in a variety of manners. One alternative is to form the metal layer as a single continuous layer and to then photolithographically define the portions of that metal layer to be retained and to then etch off the metal which is not to be retained, thereby leaving the desired metal pattern. Alternatively, the metal pattern may be formed directly in a patterned manner by the use of photo-induced selective deposition of either the metal of the layer itself or of a catalyst which facilitates electroless deposition of the metal of the layer. These techniques are explained in greater detail in some of the background HDI patents and applications.

This interconnection structure includes unique features when it is fabricated by first bonding the dielectric layer to the underlying structure, then forming the via holes in the dielectric by laser "drilling" from above and then depositing the metal of the conductors 32 and 34 over the dielectric and in the via holes where they make ohmic contact to the underlying contact pads or other metallization. In particular, the external configuration of the metal in the via hole takes on the shape of the via hole, rather than vice versa as would be the case if the metal were formed first (as by wire bonding or other processes) and the dielectric filled in around it. The nature of the laser drilling process, which is used to form the via holes by drilling from the top, typically results in a via hole which is wider at the top than at the bottom. This via hole shape provides improved metal continuity between the portion of a conductor which is disposed at the bottom of a via hole and the portion which is outside the via hole. This is because the via hole wall surface on which the metal is deposited has a sloping-upward-and-outward configuration which is known from the semiconductor arts to result in a deposited metallization layer achieving better step coverage than is achieved where the step has a vertical wall surface. The term step coverage refers to the uniformity of the metal coverage where the deposition surface changes levels from one planar surface area (the bottom of the via hole) to another planar surface area (the top of the dielectric layer). When the conductors are formed in accordance with the preferred manner described in the background Patents and Patent Applications, the upper surface of the metal conductor typically has a depression or dimple in it at the via hole because the metal of the conductors is deposited to a substantially uniform thickness everywhere, including in the via holes (which are not filled prior to deposition of the metal across the planar surface of the dielectric layer). Consequently, the surface topology of the metallization is similar to the surface topology of the layer on which it is deposited.

A second dielectric layer 36 is disposed over the dielectric layer 30 and the conductors of the first metallization pattern. This dielectric layer may preferably be a siloxane polyimide or a siloxane polyimide epoxy blend as taught in the background HDI application Ser. No. 07/454,545, filed Dec. 21, 1989, and now abandoned. This dielectric layer is preferably applied in a liquid form by spin coating or spraying and is then dried in a manner which is appropriate to the particular dielectric material selected. A second patterned metal layer is then formed on top of the dielectric layer 36. The portion of the second metal layer illustrated in FIGS. 1 and 2 comprises two ground conductors 38 which are disposed over the microwave signal conductors 32 and 34 to form a transmission line having a desired impedance at the intended operating frequency of the microwave system 10. These ground conductors 38 may be wider than the signal conductors 32 and 34 as is illustrated in FIG. 1, but may also be the same width as or narrower than the signal conductors in accordance with detailed design considerations in the particular microwave circuit being fabricated. While the ground conductors 38 are illustrated as being separate, it will be recognized that a single continuous ground conductor could be used. Separate ground conductors are preferred in order to minimize the possibility of feedback from the output side of the active microwave device 20 to the input side of that device. It will be recognized that together, the ground conductor 14 (on the package base 12), in combination with the signal conductors 32 and 34 and the ground conductors 38, form two separate strip line transmission lines, one for providing an input signal to the active microwave device 20 and the other for transmitting the output signal from that active device 20. In order for these strip line transmission lines to have a desired impedance value, the thickness and dielectric constant of the dielectric layers 30 and 36 must be selected in combination with the dimensions of the signal conductors 32 and 34 and the ground conductor 38 to provide the desired impedance at the operating frequency of the microwave system 10.

Where the input and output impedances of the active microwave component 20 at the pads 22 and 24 are accurately known, the impedance of these transmission lines can be accurately tailored by use of the adaptive lithography techniques which are described in the background HDI Patent No. 4,835,704 listed above. In particular, a desired metallization pattern is determined based on the measured impedances. That metallization may be produced in a variety of ways. First, a uniform metal layer may be deposited and then patterned by coating it with photoresist and then controlling the pattern in which the photoresist is exposed by adapting the laser exposure control instructions in accordance with the desired pattern. Second, the metallization may be selectively deposited under adaptive laser control in accordance with U.S. patent application Ser. Nos. 233,965 or 237,685 or 237,638 or 289,944 or 459,844. In addition to controlling the pattern in which the metallization layer is formed or retained, differing characteristics may be obtained in appropriate situations by relocating the position of one or more via holes which control the locations in which conductors contact an underlying layer which may be another layer of the high density interconnect structure or contact pads on the chips or the ground conductors on the chips or substrate.

The second metallization layer may also include additional conductors of the DC, logic and control variety as may be appropriate to the overall design and layout of the system. Here again, these conductors are not discussed in detail because their provision and fabrication is well explained in the background patents.

A further dielectric layer 40 may be disposed over the second metallization layer and the second dielectric layer 36, if desired. This dielectric layer 40 may have the same composition as the dielectric layer 36 or may have a different composition, as may be considered desirable. Where the dielectric layer 40 extends over the entire structure, the structure itself may be rendered hermetic or pseudo-hermetic in accordance with background HDI application Ser. No. 07/454,546, filed Dec. 21, 1989.

This structure provides a substantial advance in the microwave system packaging art for several reasons. First, the stripline transmission lines substantially eliminate the problem of impedance discontinuities at the gap between the substrate 16 and the active component 20. In the prior art, where wire bonding or tab bonding techniques were used for forming this connection, a significant impedance discontinuity occurred because of changing dielectric constants and because of the spacing between the signal conductor and the ground plane on the back of the device. This problem is substantially eliminated in the present invention because the dielectric layer 30 is continuous across this gap, the signal conductor 32 is of uniform or well controlled width in this region and because the upper dielectric layer 36 is configured to enable the ground conductor 38 to be configured to control the impedance in this portion of the structure with the changes in dielectric constant as a result of the gap between the active component and the substrate 16 having only a minor effect on that impedance.

Second, the adaptive lithography capabilities which are applicable to the fabrication of high density interconnect structures in accordance with the background HDI patents and applications, enable tailoring the impedances of the microwave transmission lines to provide controlled impedance transformation and to match known impedances of the active components in a manner to minimize system-to-system variations. Such adaptive impedance matching is preferably done by first measuring the characteristics of the active components using the techniques disclosed in Application Ser. No. 07/504,803. With those impedance values accurately known, the metallization pattern for the system is adjusted to match those impedances and, as may be appropriate, to transform those impedances in a manner to minimize reflections and other signal perturbations. This tailoring may be done by changing the width of a constant width signal line, its associated ground conductors and/or by providing a tapered signal line and/or associated ground conductor. The theory involved in determining a desired transmission line configuration being well known in the microwave art.

Figure 2:
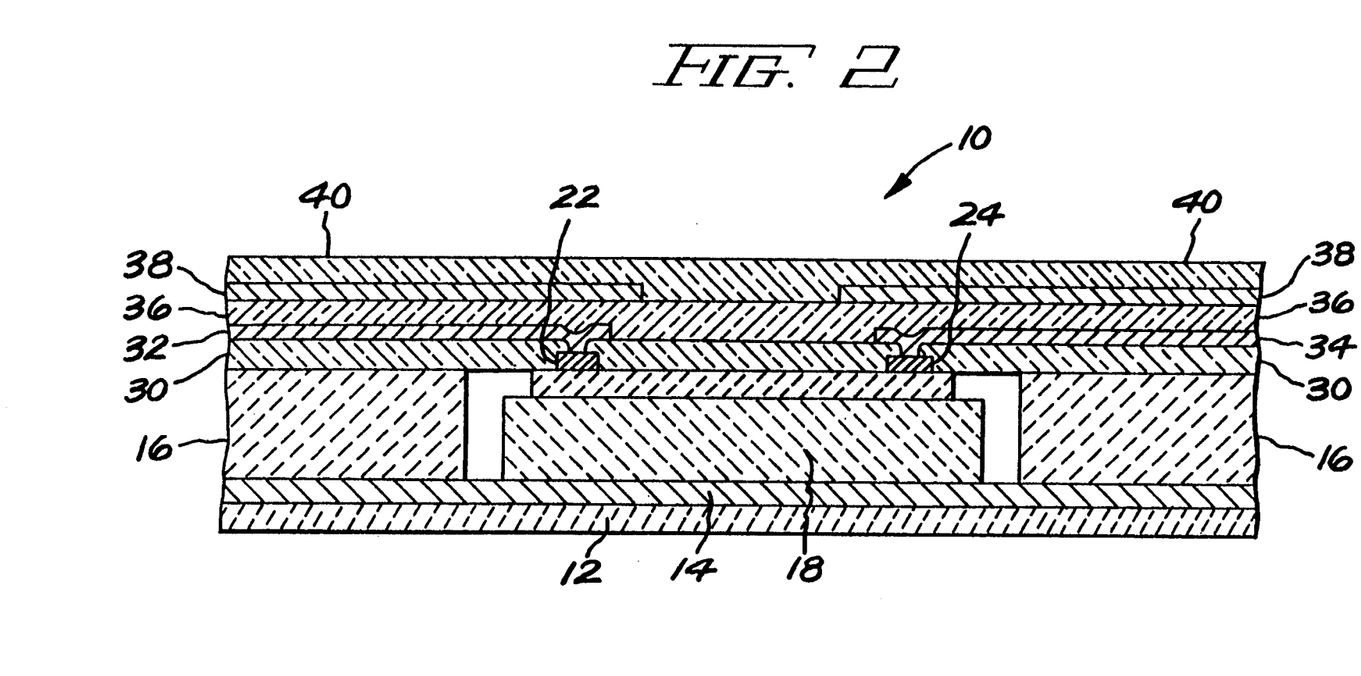
FIG. 2 is a cross-section of the structure of FIG. 1 taken along the line 2—2.

While the structure illustrated in FIGS. 1 and 2 is a significant advance in microwave packaging, the presence of the high density interconnect structure over the active microwave component can have adverse effects on the operation of that component when that component is sensitive to dielectric loading.

Figure 3:
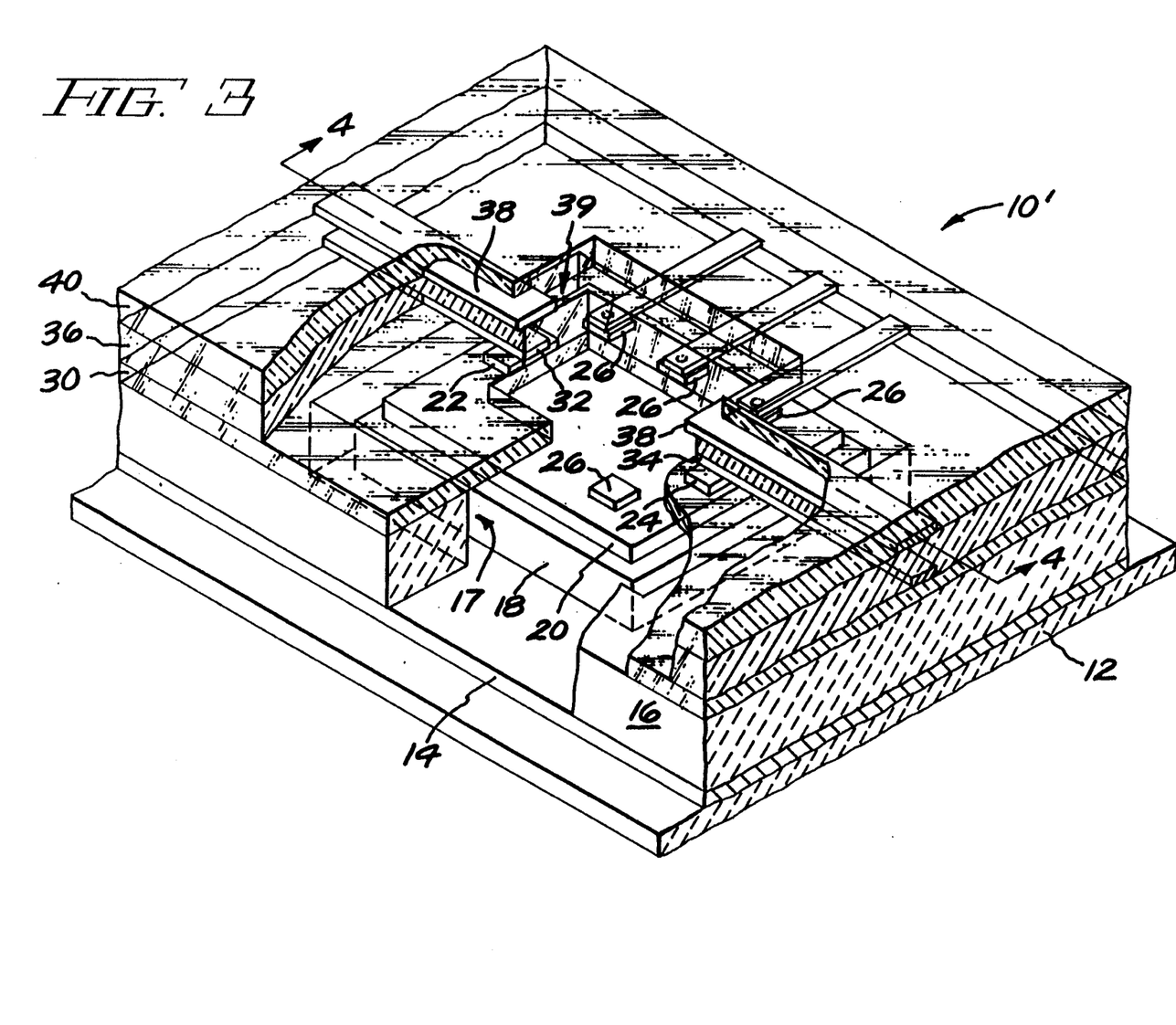
FIG. 3 is a perspective illustration of a modified version of the FIG. 1 structure.
Figure 4:
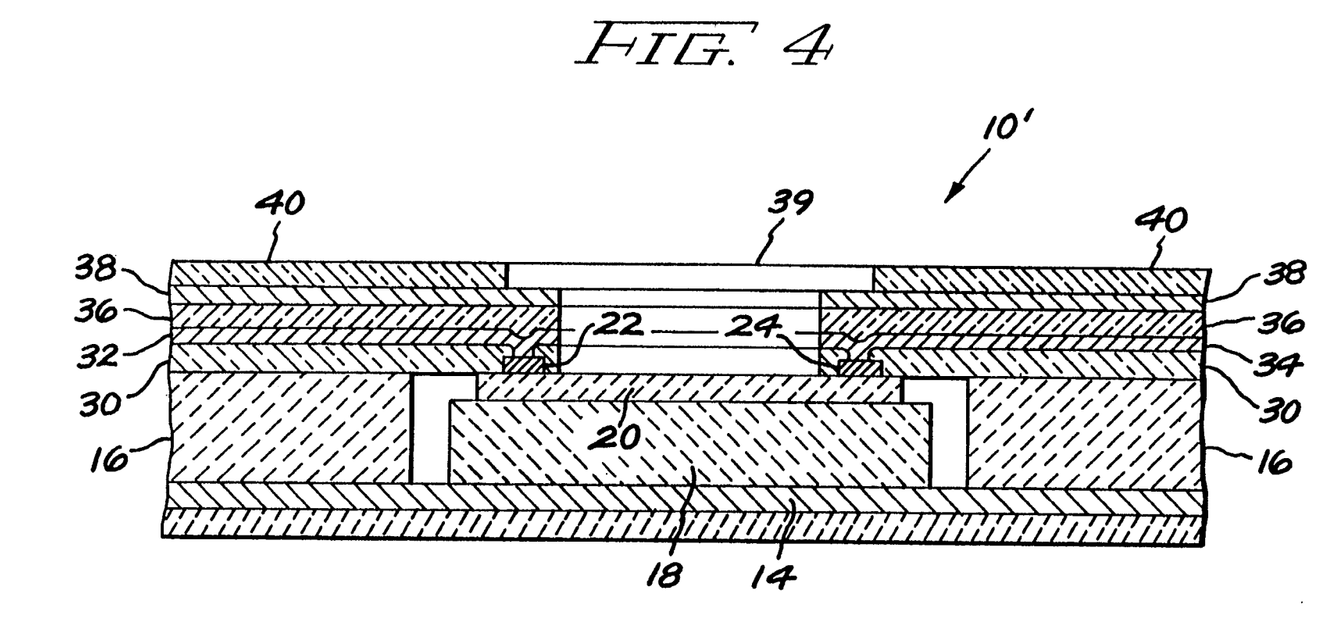
FIG. 4 is a cross-section of the FIG. 3 structure taken along the line 4—4.

A modified version 10' of the microwave system 10 which minimizes this effect is illustrated in FIGS. 3 and 4. FIG. 3 is similar to FIG. 1 and FIG. 4 is similar to FIG. 2. The microwave system 10' shown in FIGS. 3 and 4 is like that in FIGS. 1 and 2 except that the high density interconnect conductors have been patterned to minimize their overlap with the active component 20 to the extent that that is consistent with proper operation of the microwave system. Throughout this specification a reference numeral which is changed by adding a prime (') or a double prime (") identifies similar structure which has been modified, but which serves the same or a similar function. Where unmodified elements are not specifically discussed in connection with a particular figure or embodiment, the reader is referred to an earlier discussion of that element for a discussion of its purpose of function.

In microwave system 10' an aperture 39 in the dielectric layers 30, 36 and 40 is disposed over the sensitive portions of the active microwave component 20 to minimize dielectric loading on that component. This aperture 39 is preferably formed after completion of the fabrication of the high density interconnect structure by using laser ablation to remove the dielectric layers from over the active microwave component. We prefer to do this by removing the dielectric material over the entire upper surface of the active microwave component except under the HDI conductors and along the periphery of the component, whereby the dielectric structure effectively seals the gap between the active component 20 and the ceramic substrate 16. This laser ablation may preferably be done by scanning the laser across the structure in a manner which is taught in the background HDI patents for the formation of via holes, with the scan expanded and limited to the area in which it is desired to remove the dielectric layers. For simplicity, this region in which the dielectric is to be removed may be rectangular or any other desired shape. It is not necessary to modify the boundary of this dielectric layer removal region where one of the conductors extends over the active component because the metal of the conductor itself acts as a mask to prevent removal of its supporting dielectric layer. By use of the self-masking (non-transmissive or reflective) characteristics of the metal conductors, all of the dielectric material which is within the removal aperture 39 and not directly shadowed by one of the conductors may be removed during the removal process.

As an alternative, the dielectric layers may be removed only from those portions of the structure which are particularly sensitive to the presence of the dielectric layer.

It is presently preferred to apply the thermoplastic adhesive across the entire structure as part of the process of laminating the dielectric layer 30 to the substrate (including across active microwave component 20) in order to assure firm adhesion of the dielectric layer 30 to active component 20. Such firm adhesion ensures that the full accuracy of the high density interconnect structure can be achieved in the fabrication of conductors to be disposed over the active microwave component and to ensure that no processing fluids enter the aperture 17. However, if desired, the thermoplastic adhesive could be omitted from the portions of the active microwave component from which the dielectric is to be removed at the end of the process. In this manner, the overlay layers 30, 36 and 40 could be removed from this region merely by laser scribing along the edge of the non-bonded portion of the layer 30 and lifting the severed portion out. The manner of performing such a lamination process is explained in greater detail in the related application Ser. No. 07/504,769.

The process of ablating the dielectric material to be removed over the center of the microwave component may adversely effect that component, particularly the use of the plasma etch to clean up any debris or remaining adhesive. This possible adverse effect may be avoided by placing a small piece of Teflon, such as DuPont's PFA Teflon, on top of the active device to cover the region from which the dielectric is to be removed after completion of the high density interconnect fabrication process. This shield layer should be a material which will not melt or adhere to the component's surface during the high density interconnect process. The high density interconnect structure dielectric is laminated over this Teflon as well as the exposed portions of the microwave component and the upper surface of the substrate 16. Following the completion of the high density interconnect structure fabrication process, the high density interconnect structure dielectric material is cut using laser ablation along the edge of the Teflon piece. Since the PFA Teflon is not laser ablatable at the 351 nm which is perferably used for laser processing of these circuits, this cut is preferably made just outside the Teflon. The Teflon piece and the high density interconnect structure dielectric disposed thereon may then be lifted from the structure with a vacuum pencil or tweezers, as may be considered desirable. In this manner, the microwave component's surface is protected from the high density interconnect structure adhesive at all times and does not need to be exposed to clean up processes which might have an adverse effect on the microwave component or particular elements or devices in its structure. Alternatively, an adhesive or other material which is not laser ablatable at 351 nm but which is solvent dissolvable may be disposed on the portion of the device from which it is desired to remove the dielectric prior to laminating the first layer of high density interconnect dielectric to the chip. After completion of the high density interconnect structure fabrication process, the high density interconnect dielectric over this portion of the chip is laser ablated, a clean up plasma etch it done and the non-ablatable material over this portion of the chip is dissolved. This protects the chip's surface from the plasma etch.

Figure 5:
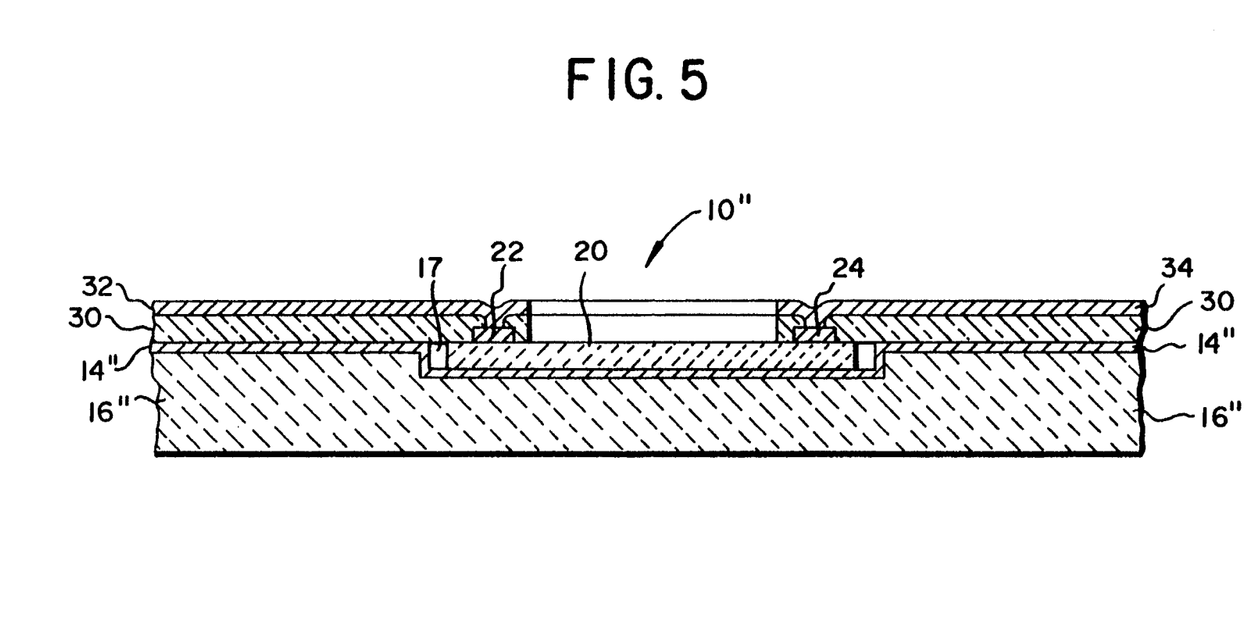
FIG. 5 is a cross section of a portion of another microwave system in accordance with the present invention.

A further alternative embodiment 10″ of the present invention is illustrated in a cross-section view in FIG. 5. The cross-section view in FIG. 5 is similar to the cross-sections views of FIGS. 2 and 4 in that it extends through the middle of the microwave component and two transmission lines which are connected thereto. In FIG. 5, the ceramic substrate 16″ extends beneath the entire high density interconnect structure and the microwave component 20. The substrate 16″ has a metallization coating 14″ disposed on its upper surface, including on the bottom of the cavity 17, the walls of the cavity 17 and the planar portion of the substrate's upper surface. This metallization may be a single layer of One metal or may be a multilayer structure including a number of different metals deposited in sequence. The conductive layer 14″ may be formed on the substrate 16″ in any of a variety of manners. It may be formed by sputtering, by other vacuum deposition process or by sensitizing the upper surface of the substrate 16″ for electroless plating followed by electroless plating of a conductive layer such as copper. The electroless plating of a conductive layer on the upper surface of the substrate 16″ may be coupled with subsequent electroplating to provide a thicker conductive layer 14″. It will be appreciated, however, that substrate 16″ may, alternatively, be comprised of electrically conductive material.

The layer 14″ serves as a ground plane for the high density interconnect microwave structure. The chip 20 is preferably soldered to the conductive layer 14″ to provide a uniform, high electrical and thermal conductivity connection between the chip 20 and the ground conductor 14″. Alternatively, a conductive adhesive may be employed or, if electrical isolation is desired, a non-conductive adhesive may be employed. Thereafter, the adhesive layer 30 is laminated on the upper surface of the chip 20 and the conducting layer 14″. Via holes are then laser drilled in the dielectric layer 30 in alignment with contact pads such as 22 and 24 to which it is desired to make contact with the high density interconnect structure conductors. Next, the conductive layer from which conductors 32 and 34 are formed is deposited on the upper surface of the dielectric layer 30 and patterned in an appropriate manner. This patterning may be done by depositing a uniform layer and using photoresist and etching to pattern it or by selectively depositing the metal in only its desired locations in the first place. After completion of the patterning of the metal layer, the central portion of the dielectric layer 30 is removed from the chip in the manner which has been described. This structure is substantially simpler to fabricate than the multilayer structure illustrated in FIGS. 1-4. In this structure, the conductive layer 14″ serves as the ground conductor of transmission lines with the dielectric layer 30 serving as the dielectric of the transmission lines and with conductors like the conductors 32 and 34 (disposed on dielectric layer 30) serving as the signal conductors of transmission lines. In the event that the contact pad to which the particular conductor is connected is not part of a microwave conduction path, then that conductor may serve as a logic, control or power supply line.

This structure is adequate for connecting many microwave chips, integrated circuits, active devices and so forth. Since it is substantially simpler to fabricate than the multilayer structure of FIGS. 1-4, the structure of FIG. 5 is preferred in those situations where it provides sufficient connectivity among the various chips and components to be interconnected by the high density interconnect structure.

This interconnect structure preferably includes the transmission lines which extend from one microwave component to another as part of the high density interconnect structure itself. This is because of the very tight tolerances with which that structure may be fabricated. We routinely produce conductor lines which are 0.8 mils wide which have straight, smooth boundaries. We estimate the variation in the width of these conductors to be on the order of $\pm 5\%$ from their nominal 0.8 mil width. This improved line edge accuracy can be obtained with wider conductors since the location of the edge of the line is controlled in a similar manner. These fabrication tolerances are tighter by a factor of about 5 than the fabrication tolerances which can be obtained where transmission line structures on the substrate 16 are formed by thick film processing techniques, where for lines of a width of 5 mil, a line width tolerance of $\pm 10\%$ is typical. Further, the thickness and dielectric constant of the dielectric layers in the HDI structure may be much more accurately controlled than they can be in thin and thick film fabrication techniques.

As important as all these considerations are, a potentially much more significant consideration in the use of this high density interconnect structure to fabricate the microwave system 10, is the fact that this interconnect structure can be removed and reapplied without damage to the active microwave components. This also makes removal of defective components such as MMICs and GaAs transistors feasible as a normal part of the fabrication process. This means that after fabrication and testing of a system 10, a system which does not meet specifications can have the interconnection structure removed, any out-of-tolerance or inoperative active components removed and replaced with other components. A new interconnect structure may then be applied and the system retested. This reworking may be done multiple times, if necessary. Thus, rather than a system which contains one or more inoperative or out-of-tolerance components having to be scrapped (as in the prior art), the entire system can be saved with only the faulty components being thrown out. Thus, this interconnect process and structure drastically improves the yield of microwave system fabrication processes and will consequently substantially reduce the cost of such systems.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A electronic system comprising:
    a substrate having a first surface;
    a ground plane conductor disposed on said first surface;
    an electronic component disposed on a surface of said ground plane conductor, said component having a first surface facing away from said ground plane conductor and a terminal disposed on said first surface of said electronic component, said electronic component having an impedance as seen at said terminal;
    a dielectric layer overlying and bonded to at least portions of said ground plane conductor and said first surface of said electronic component; and
    at least one signal conductor disposed in ohmic electrical contact with said terminal of said electronic component and spaced from at least some portions of said electronic component by said dielectric layer, and extending from over said component to over said first surface of said substrate; and
    said ground plane conductor being spaced from said signal conductor by said dielectric layer to form with said signal conductor a transmission line having an impedance which matches the impedance of said electronic component as seen at said terminal.

2. The electronic system recited in claim 1 wherein: said transmission line is a microstrip transmission line.

3. The electronic system recited in claim 1 wherein: said electronic component is bonded to said ground plane conductor.

4. The electronic system recited in claim 1 wherein: said dielectric layer has a thickness and a dielectric constant and said signal conductor has a size which is related with the dielectric constant of said dielectric to provide said transmission line with said matching impedance.

5. The electronic system recited in claim 1 wherein: said substrate includes a cavity in which said electronic component is disposed.

6. The electronic system recited in claim 1 wherein: said component is disposed with the first surface thereof lying substantially in a common plane with an adjacent portion of said surface of said ground plane conductor.

7. The electronic system recited in claim 1 wherein: a portion of said first surface of said electronic component is free of said dielectric layer.

8. The electronic system recited in claim 7 wherein: said dielectric layer is present only under said at least one signal conductor.

9. The electronic system recited in claim 1 wherein: said substrate is electrically conductive.

10. The electronic system comprising:
    a substrate having a first surface;
    an electronic component disposed on said substrate, said component having a first surface facing away from said first surface of said substrate and a terminal disposed on said first surface of said electronic component, said electronic component having an impedance as seen at said terminal;
    a dielectric layer overlying and bonded to at least portions of said first surfaces of said substrate and said electronic component;
    a window in said dielectric layer in the form of an aperture;
    at least one signal conductor disposed in ohmic electrical contact with said terminal of said electronic component and spaced from at least some portions of said electronic component by said dielectric layer, and extending from over said component to over said first surface of said substrate; and
    a ground conductor spaced from said signal conductor by said dielectric layer to form with said signal conductor a transmission line having an impedance which matches the impedance of said electronic component as seen at said terminal.

11. The electronic system recited in claim 10 wherein: said window encompasses a portion of said component having characteristics which are adversely affected by the presence of overlying dielectric layers.

12. The electronic system recited in claim 11 wherein: said window has a simple geometric configuration.

13. The electronic system recited in claim 11 wherein: said window has a simple geometric outline except for locations in which said a portion of said at least one signal conductor is disposed inside said simple geometric outline, the outline of said window following said signal conductors where they are disposed within said simple geometric outline.

14. In a method of fabricating a high density interconnect structure including providing an electronic component having contact pads thereon, providing one or more polymer dielectric layers disposed over the component, bonded to the component and having apertures, providing one or more patterned conductive layers disposed on the dielectric layers and extending into selected ones of said apertures into ohmic contact with selected contact pads, the improvement comprising:
    forming a window in the dielectric layer of said high density interconnect structure over at least a portion of said electronic component to define an exposed portion of said component, and leaving said exposed portion free of direct contact with solid material.

15. The electronic system recited in claim 14 which comprises:
    forming said window to expose a portion of said component having characteristics which are adversely affected by the presence of overlying dielectric layers.

16. The electronic system recited in claim 15 which comprises:
    forming said window with a simple geometric outline except for locations in which one or more of said patterned conductive layers is disposed within said simple geometric outline, the outline of said window following said patterned conductive layers where they are disposed within said simple geometric outline.

17. The electronic system recited in claim 15 which comprises:
    allowing the dielectric layer to remain continuous over the remainder of said structure.

18. The electronic system recited in claim 17 which comprises:
    forming said window with a simple geometric configuration.

19. The electronic system recited in claim 17 which comprises:
    forming said window with a simple geometric outline except for locations in which one or more of said patterned conductive layers is disposed within said simple geometric outline, the outline of said window following said patterned conductive layers where they are disposed within said simple geometric outline.

20. The electronic system recited in claim 15 which comprises:
    forming said window with a simple geometric configuration.

21. The method recited in claim 14 comprising the step of:
    disposing one of said patterned conductive layers in a position to create a microwave transmission line.

22. The method recited in claim 21 wherein the step of disposing comprises:
    configuring said one of said patterned conductive layers to provide said microwave transmission line with a specified impedance.

* * * * *